Figure 1:
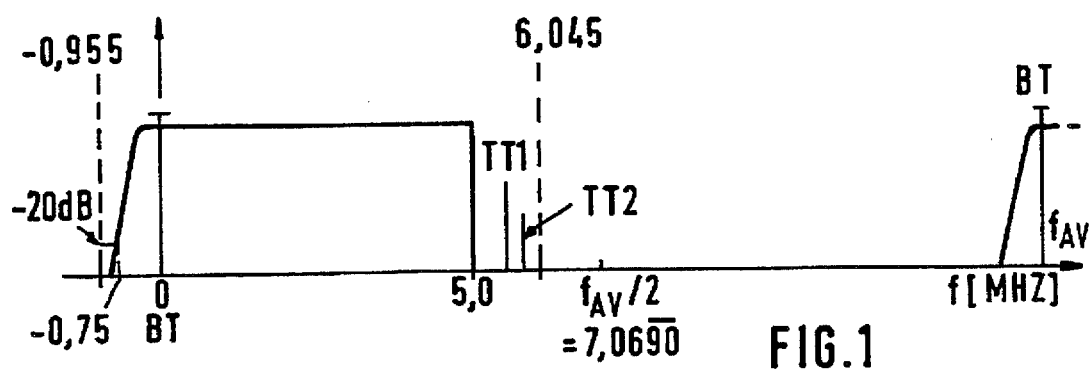

United States Patent [19]
Goeckler

[11] Patent Number: 5,663,773
[45] Date of Patent: Sep. 2, 1997

[54] DEMODULATOR FOR A COMPLEX-VALUE VESTIGIAL SIDEBAND SIGNAL

[75] Inventor: Heinz Goeckler, Backnang, Germany

[73] Assignee: ANT Nachrichtentechnik GmbH, Backnang, Germany

[21] Appl. No.: 561,123

[22] Filed: Nov. 20, 1995

[30] Foreign Application Priority Data

Dec. 16, 1994 [DE] Germany ................ 44 44 870.8

[51] Int. Cl.$^6$ ........................................... H04N 5/455
[52] U.S. Cl. ................ 348/726; 348/736; 329/357; 455/337
[58] Field of Search ................ 348/726, 736, 348/738, 484, 486; 329/341, 357; 375/277, 316, 321, 324; 364/724.1; 455/214, 337; H04N 5/60, 5/455

[56] References Cited

U.S. PATENT DOCUMENTS

| | | | |
|---|---|---|---|
| 4,803,700 | 2/1989 | Dewey et al. | 329/357 |
| 5,177,611 | 1/1993 | Gibson et al. | 348/607 |
| 5,220,602 | 6/1993 | Robbins et al. | 348/736 |
| 5,477,199 | 12/1995 | Montreuil | 329/357 |
| 5,541,672 | 7/1996 | Goeckler | 348/726 |
| 5,568,206 | 10/1996 | Goechler | 348/726 |
| 5,570,137 | 10/1996 | Goechler | 348/726 |

FOREIGN PATENT DOCUMENTS

| | | | |
|---|---|---|---|
| 3705207 | 6/1989 | Germany | H03H 17/06 |
| 3705206 | 10/1989 | Germany | H03H 17/06 |
| 4305075 | 7/1994 | Germany | H03H 17/02 |

OTHER PUBLICATIONS

Kammeyer, et al, "Digitale Signalverarbeitung", B.G. Teubner Stuttgart, 1992, pp. 122–136.

Antoniou, A., Digital Filters, Analysis, Design and Applications, Electrical Engineering Series, Second Edition, pp. 602–625, 1993.

Primary Examiner—Michael H. Lee
Assistant Examiner—Jeffrey S. Murrell
Attorney, Agent, or Firm—Michael J. Striker

[57] ABSTRACT

In a demodulator for a complex-value vestigial sideband signal, a Nyquist slope filter which consists of two subfilters (Ra, Ia) is used, a filter device (FBASTP) being connected downstream of, or also capable of being integrated in, the said Nyquist slope filter, in order to suppress subcarriers, specifically in such a way that the real parts (Ra) and imaginary parts (Ia) of the sub-filters can be combined in each case.

21 Claims, 18 Drawing Sheets

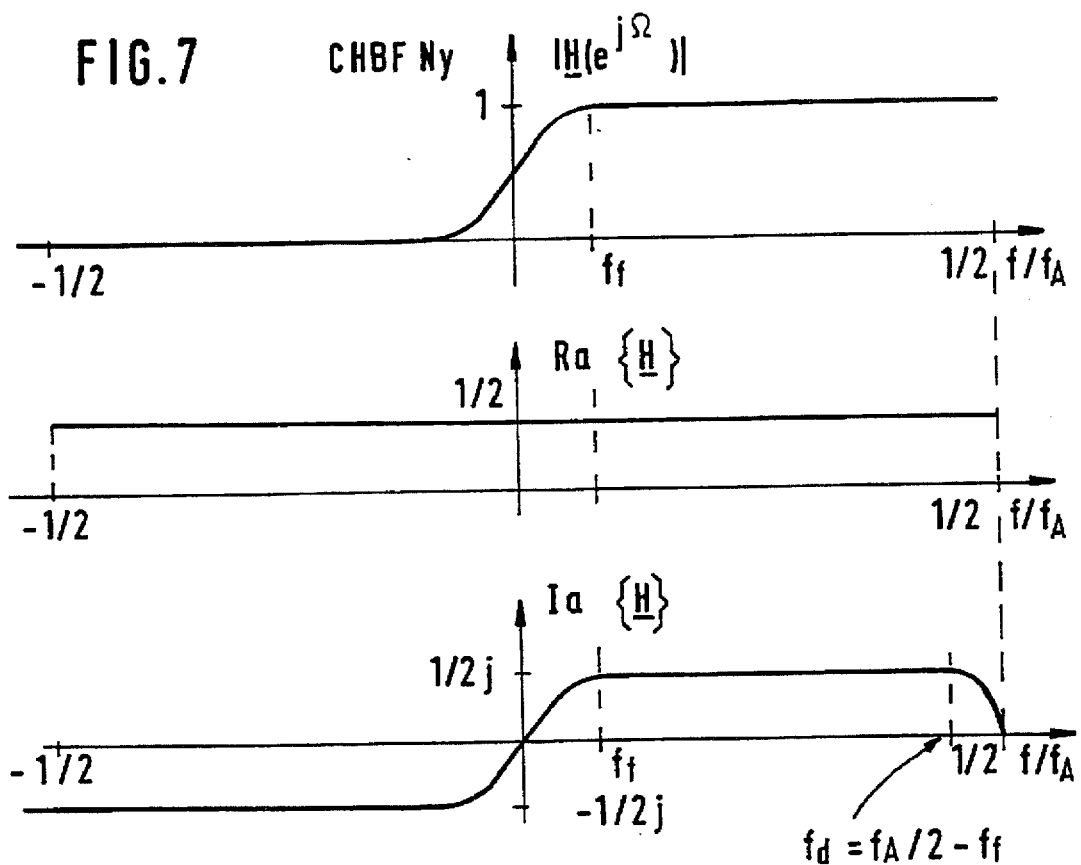
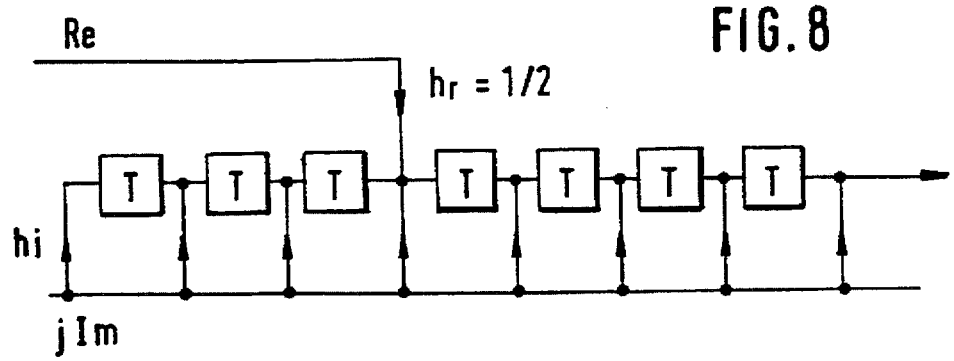

FIG.10A

| | | |
|---|---|---|
| 1 | | -0.119110E-01 |
| 2 | | 0.000000E+00 |
| 3 | | -0.226528E-01 |
| 4 | | 0.000000E+00 |
| 5 | | -0.453826E-01 |
| 6 | | 0.000000E+00 |
| 7 | | -0.942666E-01 |
| 8 | | 0.000000E+00 |
| 9 | | -0.314213E+00 |
| 10 | 0.500000E+00 | 0.000000E+00 |
| 11 | | 0.314213E+00 |
| 12 | | 0.000000E+00 |
| 13 | | 0.942666E-01 |
| 14 | | 0.000000E+00 |
| 15 | | 0.453826E-01 |
| 16 | | 0.000000E+00 |
| 17 | | 0.226528E-01 |
| 18 | | 0.000000E+00 |
| 19 | | 0.119110E-01 |

FIG. 10B

| | | |
|---|---|---|
| 1 | 0.471917E-03 | 0.000000E+00 |
| 2 | 0.604320E-02 | 0.000000E+00 |
| 3 | -0.116610E-01 | 0.000000E+00 |
| 4 | 0.182580E-01 | 0.000000E+00 |
| 5 | -0.230852E-01 | 0.000000E+00 |
| 6 | 0.249729E-01 | 0.000000E+00 |
| 7 | -0.246945E-01 | 0.000000E+00 |
| 8 | 0.244438E-01 | 0.000000E+00 |
| 9 | -0.260573E-01 | 0.000000E+00 |
| 10 | 0.291383E-01 | 0.000000E+00 |
| 11 | -0.306160E-01 | 0.000000E+00 |
| 12 | 0.264909E-01 | 0.000000E+00 |
| 13 | -0.149334E-01 | 0.000000E+00 |
| 14 | -0.140258E-02 | 0.000000E+00 |
| 15 | 0.158794E-01 | 0.000000E+00 |
| 16 | -0.215101E-01 | 0.000000E+00 |
| 17 | 0.157253E-01 | 0.000000E+00 |
| 18 | -0.295064E-02 | 0.000000E+00 |
| 19 | -0.739308E-02 | 0.000000E+00 |
| 20 | 0.690521E-02 | 0.000000E+00 |
| 21 | 0.535114E-02 | 0.000000E+00 |
| 22 | -0.206458E-01 | 0.000000E+00 |
| 23 | 0.250783E-01 | 0.000000E+00 |
| 24 | -0.903323E-02 | 0.000000E+00 |
| 25 | -0.241253E-01 | 0.000000E+00 |
| 26 | 0.562031E-01 | 0.000000E+00 |
| 27 | -0.618794E-01 | 0.000000E+00 |
| 28 | 0.227379E-01 | 0.000000E+00 |
| 29 | 0.601375E-01 | 0.000000E+00 |
| 30 | -0.162816E+00 | 0.000000E+00 |
| 31 | 0.247569E+00 | 0.000000E+00 |
| 32 | 0.719640E+00 | 0.000000E+00 |
| 33 | 0.247569E+00 | 0.000000E+00 |
| 34 | -0.162816E+00 | 0.000000E+00 |
| 35 | 0.601375E-01 | 0.000000E+00 |
| 36 | 0.227379E-01 | 0.000000E+00 |
| 37 | -0.618794E-01 | 0.000000E+00 |
| 38 | 0.562031E-01 | 0.000000E+00 |
| 39 | -0.241253E-01 | 0.000000E+00 |
| 40 | -0.903323E-02 | 0.000000E+00 |
| 41 | 0.250783E-01 | 0.000000E+00 |
| 42 | -0.206458E-01 | 0.000000E+00 |
| 43 | 0.535114E-02 | 0.000000E+00 |

| | | |
|---|---|---|
| 44 | 0.690521E-02 | 0.000000E+00 |
| 45 | -0.739308E-02 | 0.000000E+00 |
| 46 | -0.295064E-02 | 0.000000E+00 |
| 47 | 0.157253E-01 | 0.000000E+00 |
| 48 | -0.215101E-01 | 0.000000E+00 |
| 49 | 0.158794E-01 | 0.000000E+00 |
| 50 | -0.140258E-02 | 0.000000E+00 |
| 51 | -0.149334E-01 | 0.000000E+00 |
| 52 | 0.264909E-01 | 0.000000E+00 |
| 53 | -0.306160E-01 | 0.000000E+00 |
| 54 | 0.291383E-01 | 0.000000E+00 |
| 55 | -0.260573E-01 | 0.000000E+00 |
| 56 | 0.244438E-01 | 0.000000E+00 |
| 57 | -0.246945E-01 | 0.000000E+00 |
| 58 | 0.249729E-01 | 0.000000E+00 |
| 59 | -0.230852E-01 | 0.000000E+00 |
| 60 | 0.182580E-01 | 0.000000E+00 |
| 61 | -0.116610E-01 | 0.000000E+00 |
| 62 | 0.604320E-02 | 0.000000E+00 |
| 63 | 0.471917E-03 | 0.000000E+00 |
FIG.10C
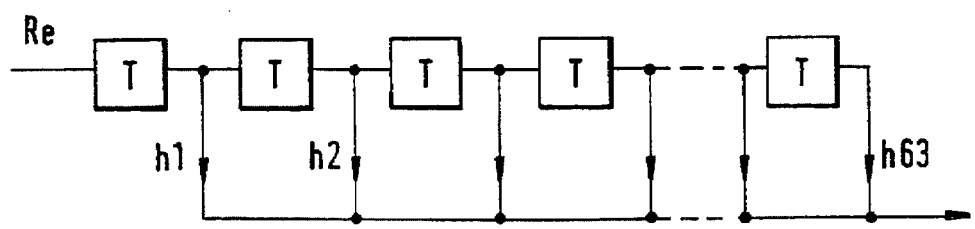
FIG.10
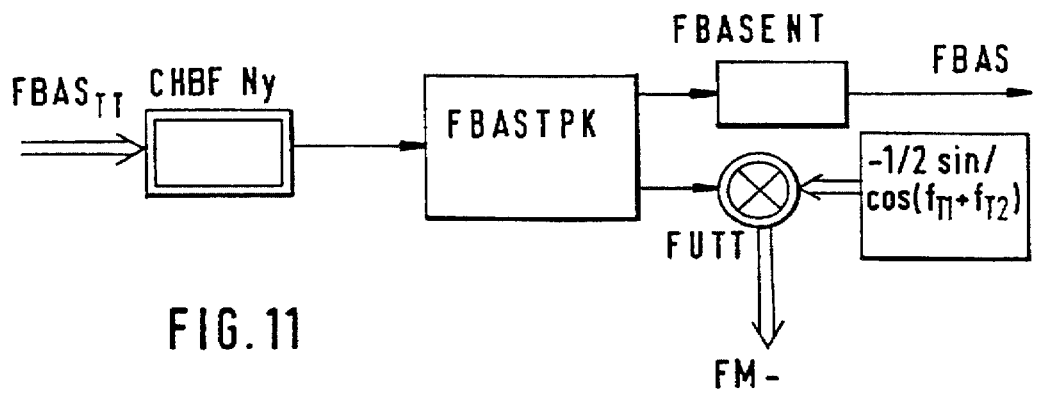
FIG.11

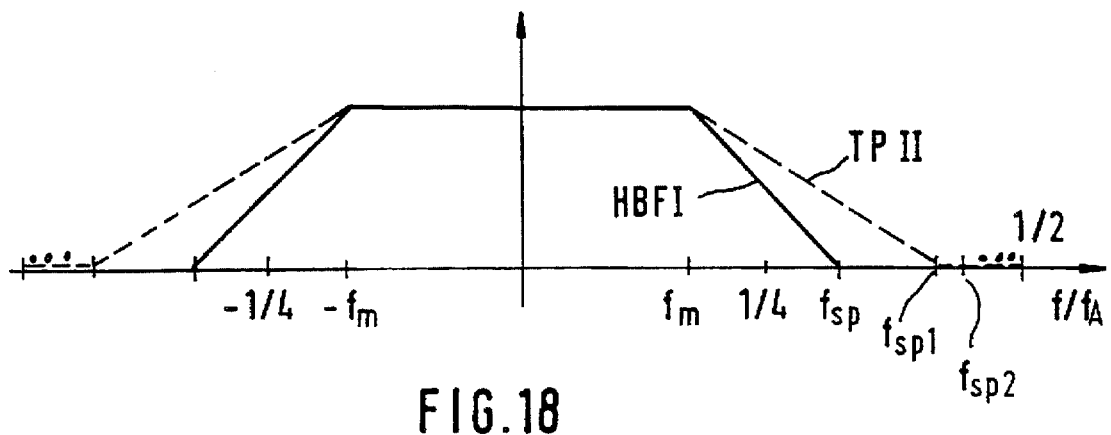
FIG.18
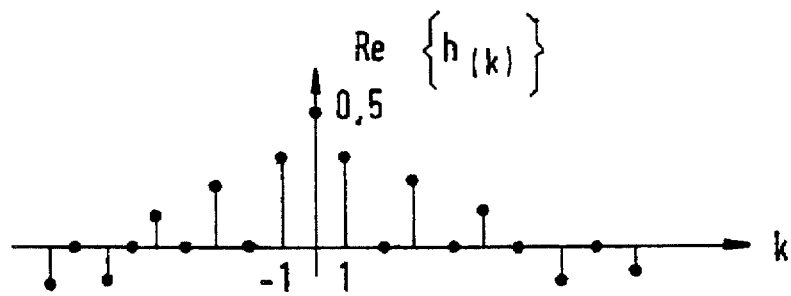
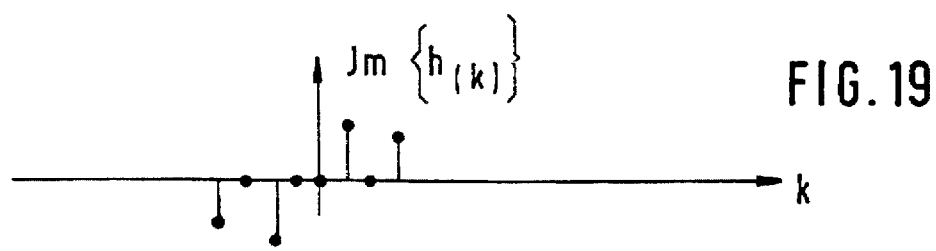
FIG.19

DEMODULATOR FOR A COMPLEX-VALUE VESTIGIAL SIDEBAND SIGNAL

The invention relates to a demodulator for a complex-value vestigial sideband signal, in particular a television signal.

|1| "Digitale Signalverarbeitung—Filterung und Spektralanalyse" ("Digital signal processing—filtering and spectral analysis"), K. D. Kammeyer, K. Kroschel, Teubner 1992, Stuttgart, pp. 122 to 133, specifies filters for complex-value signals, which filters are made up of subfilters, depending on the required selection properties. Here, one of the subfilters can constitute a Hilbert Transformation function. The filters presented there can be conceived for any desired selection properties, but are very complex.

DE 37 05 206 C2 and DE 37 05 207 C2 |2| disclose non-recursive halfband filters with complex coefficients for processing a complex-value input signal. This is less complex, but the selection properties cannot be freely selected.

The object of the present invention is to specify a demodulator for a complex-value vestigial sideband signal whose complexity is relatively low and which has selectable selection properties, for example for separating off sound carriers.

This object is achieved by means of the features of claim 1. The further claims exhibit advantageous refinements.

The demodulator according to the invention is suitable as a vestigial sideband demodulator, in particular for the demodulation of composite color television picture signals with simultaneous separation of the sound carriers. The demodulator supplies a Nyquist slope in the desired region and has sufficient selection properties despite reduced complexity in comparison with the realization according to |1|. The demodulator according to the invention permits simple extraction of subcarriers, for example sound carriers, for an extremely wide variety of sound demodulator schemes.

Figure 2:
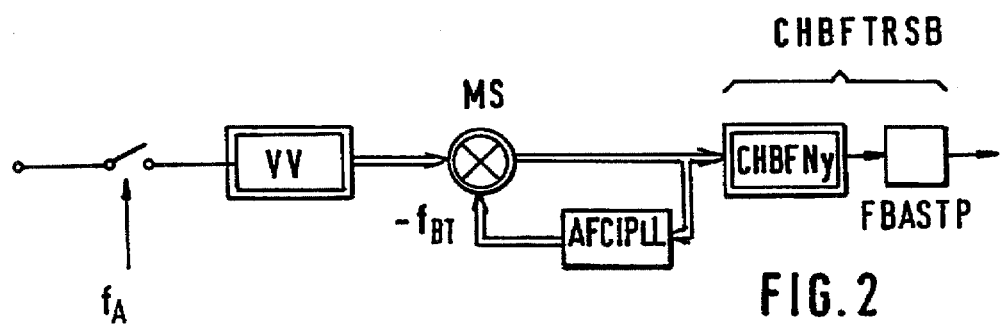
Figure 3:
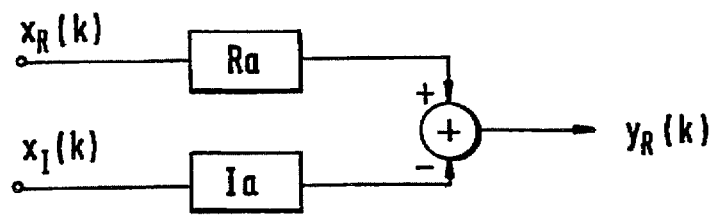
Figure 4:
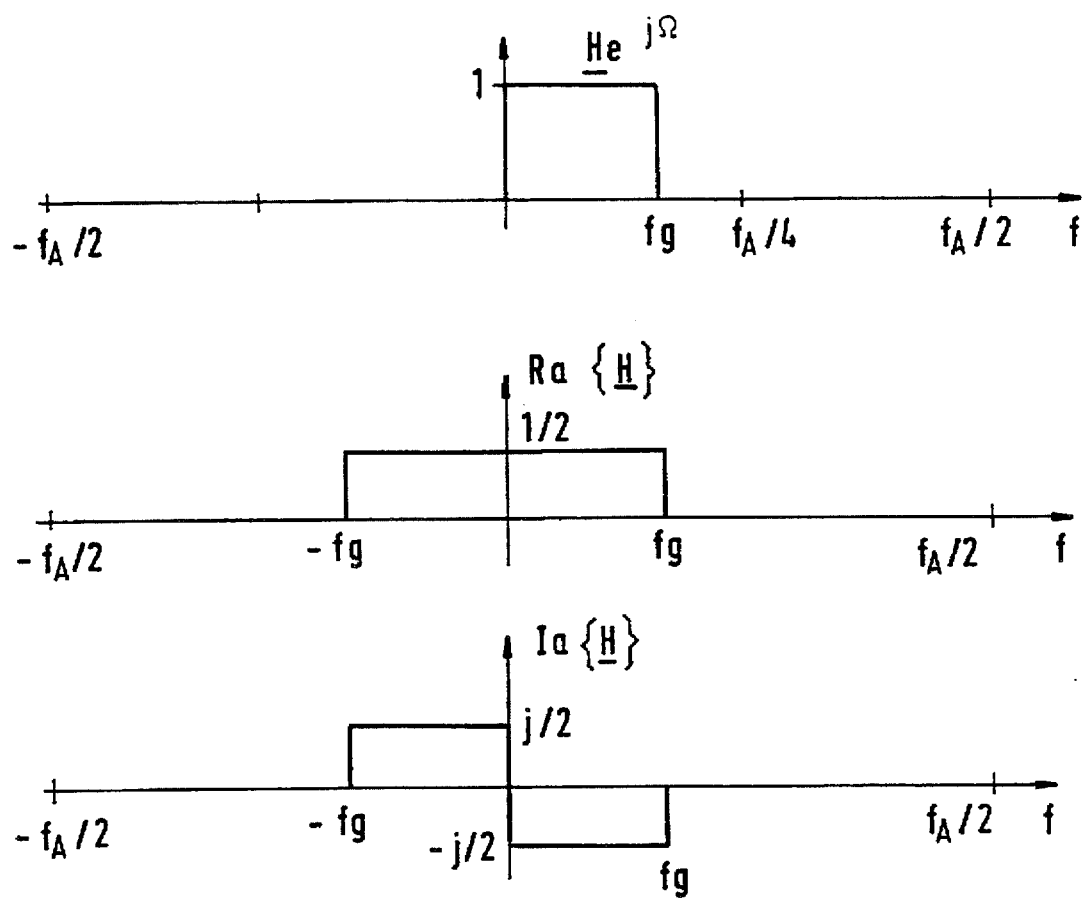
Figure 6:
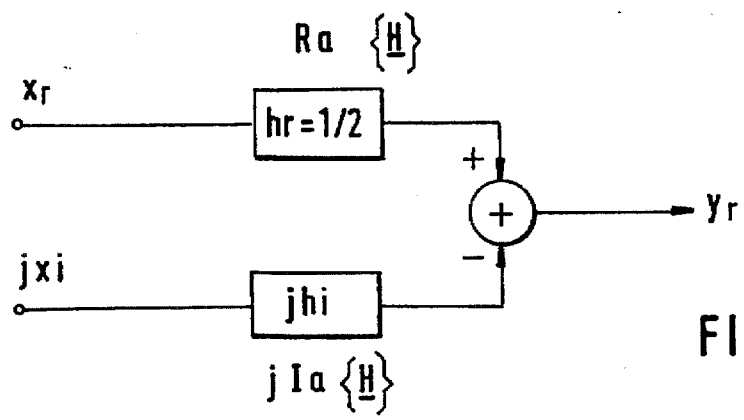
Figure 5:
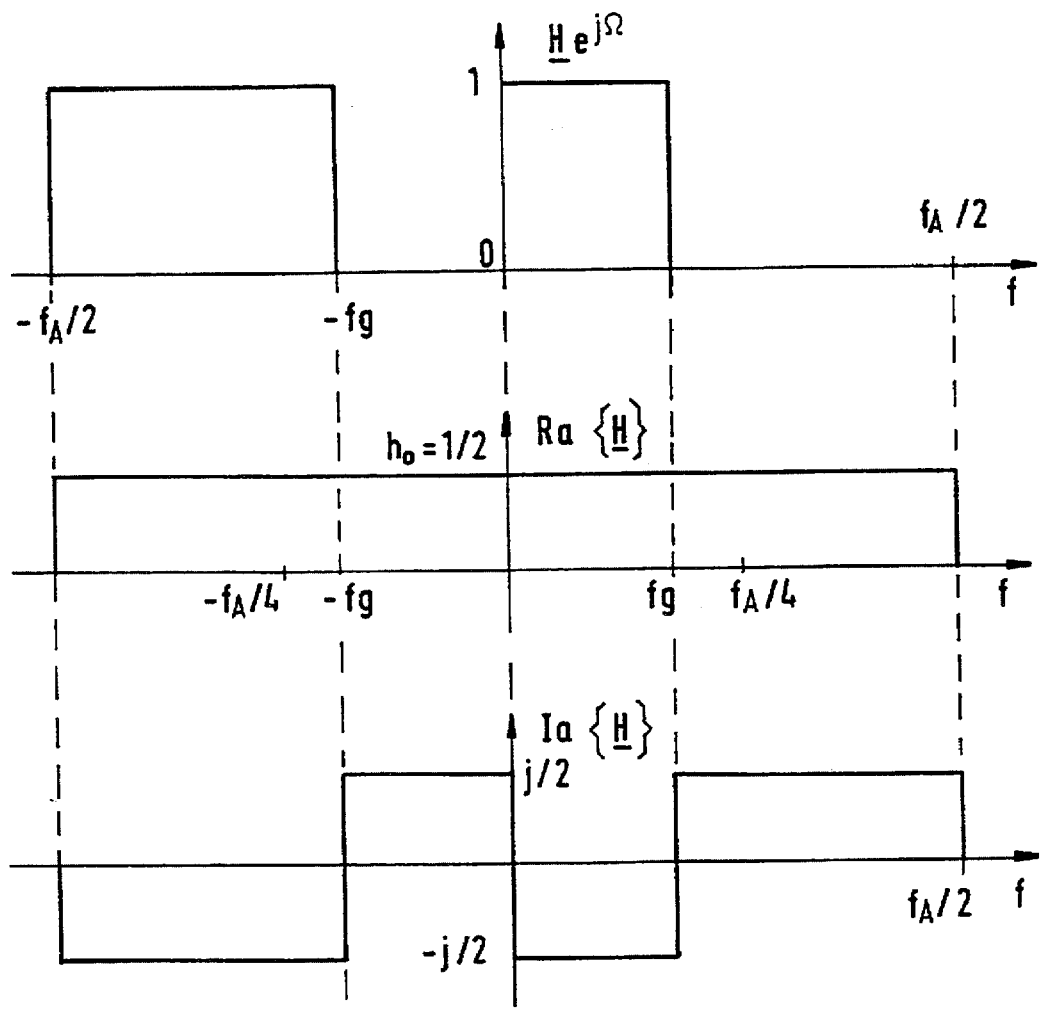
Figure 9:
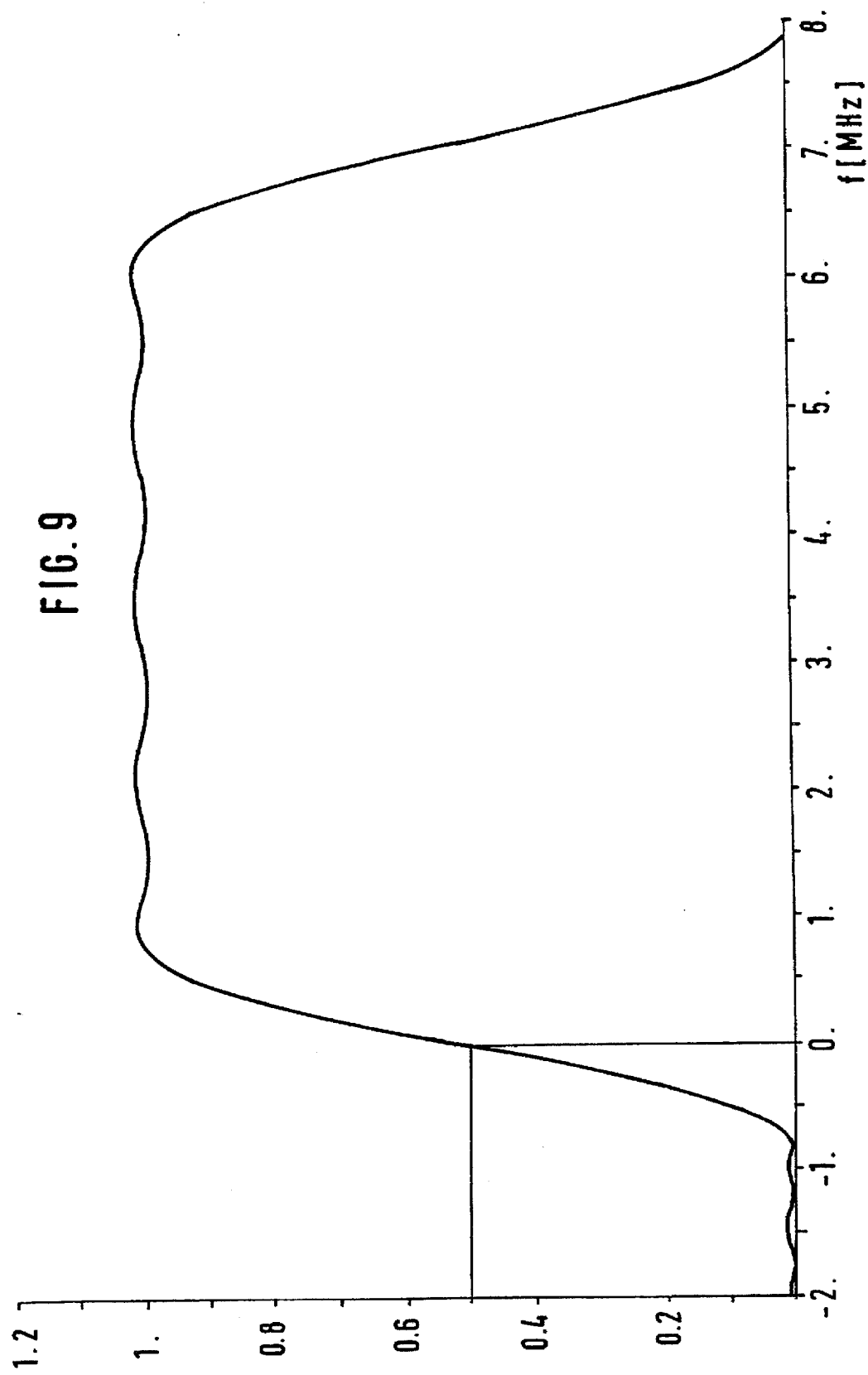
Figure 12A:
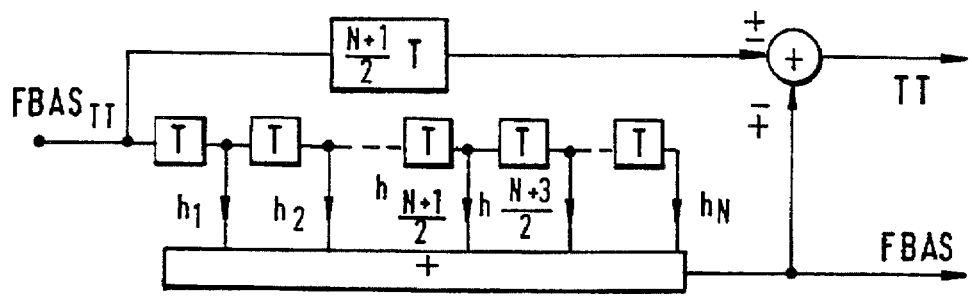
Figure 12B:
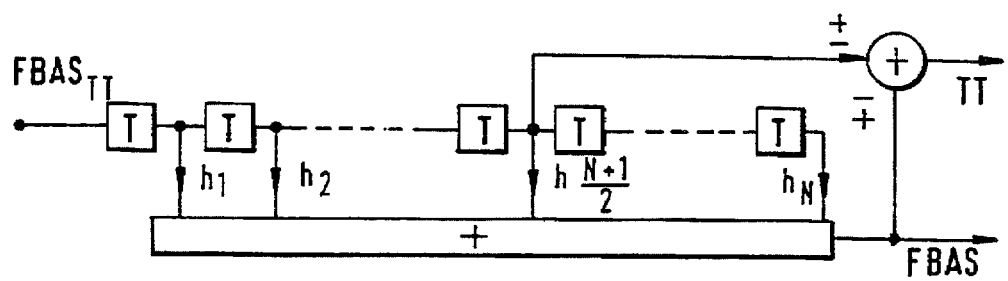
Figure 12C:
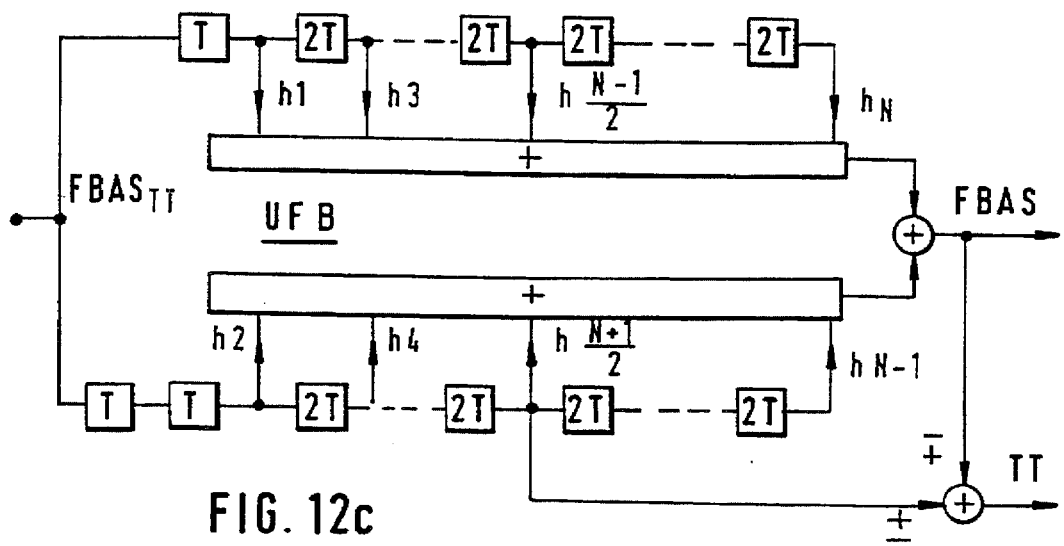
Figure 13:
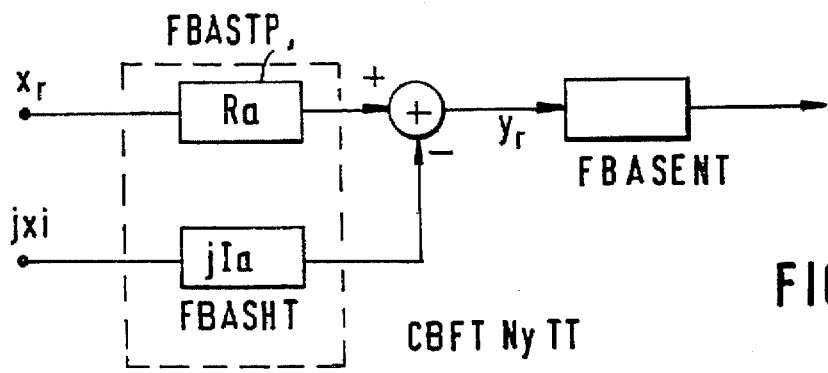
Figure 14:
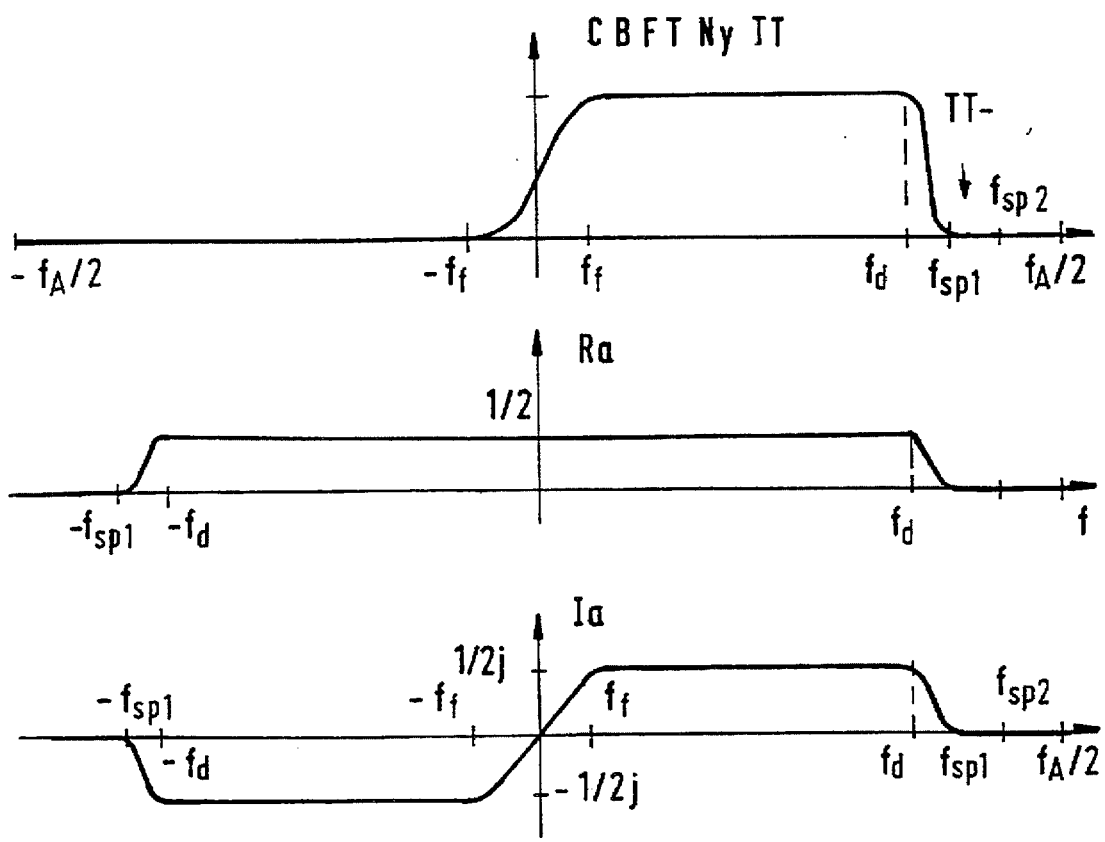
Figure 15:
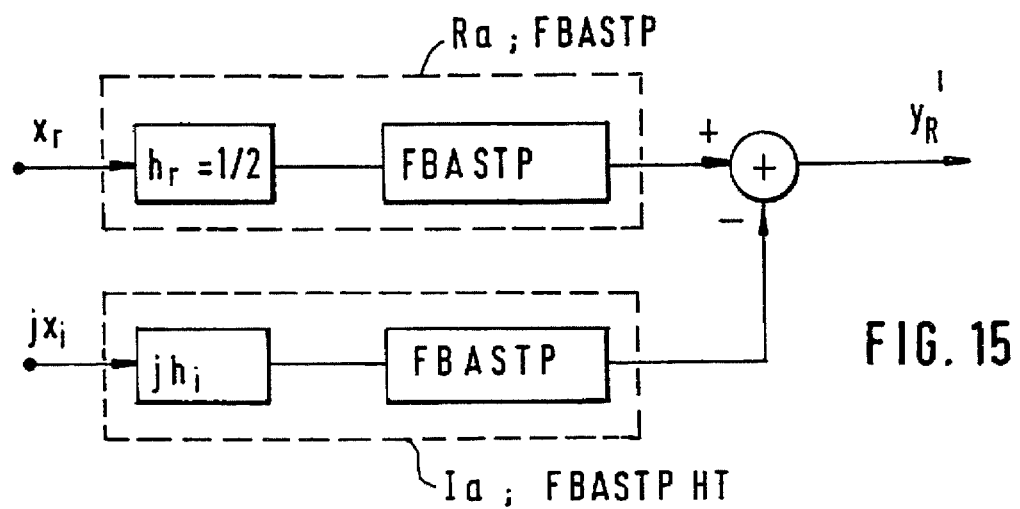
Figure 16:
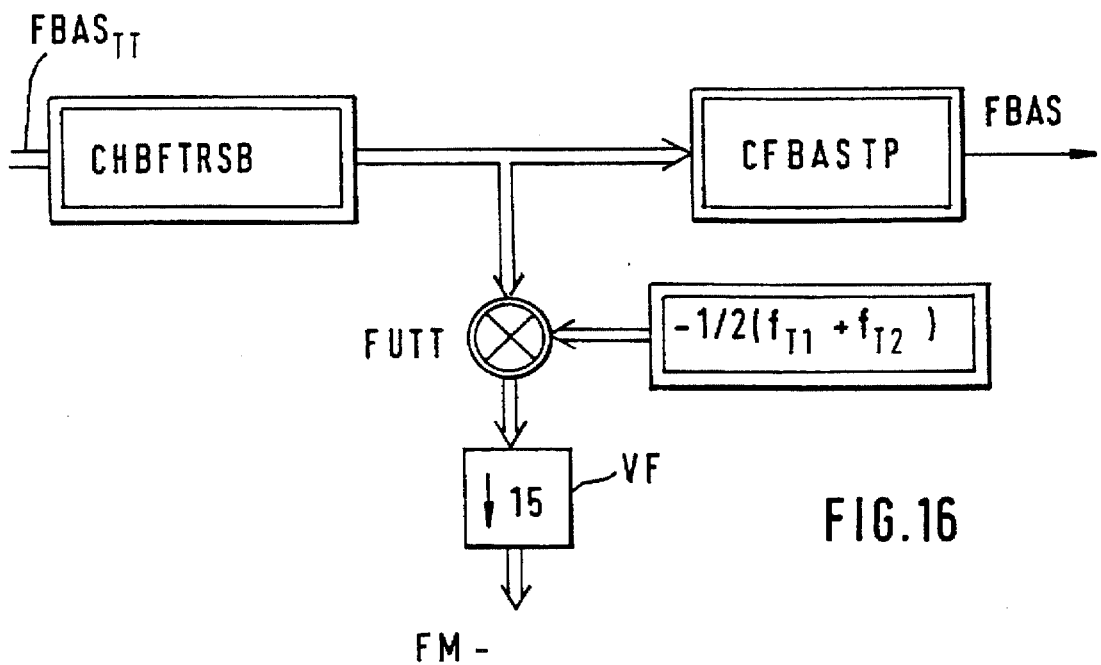
Figure 17:
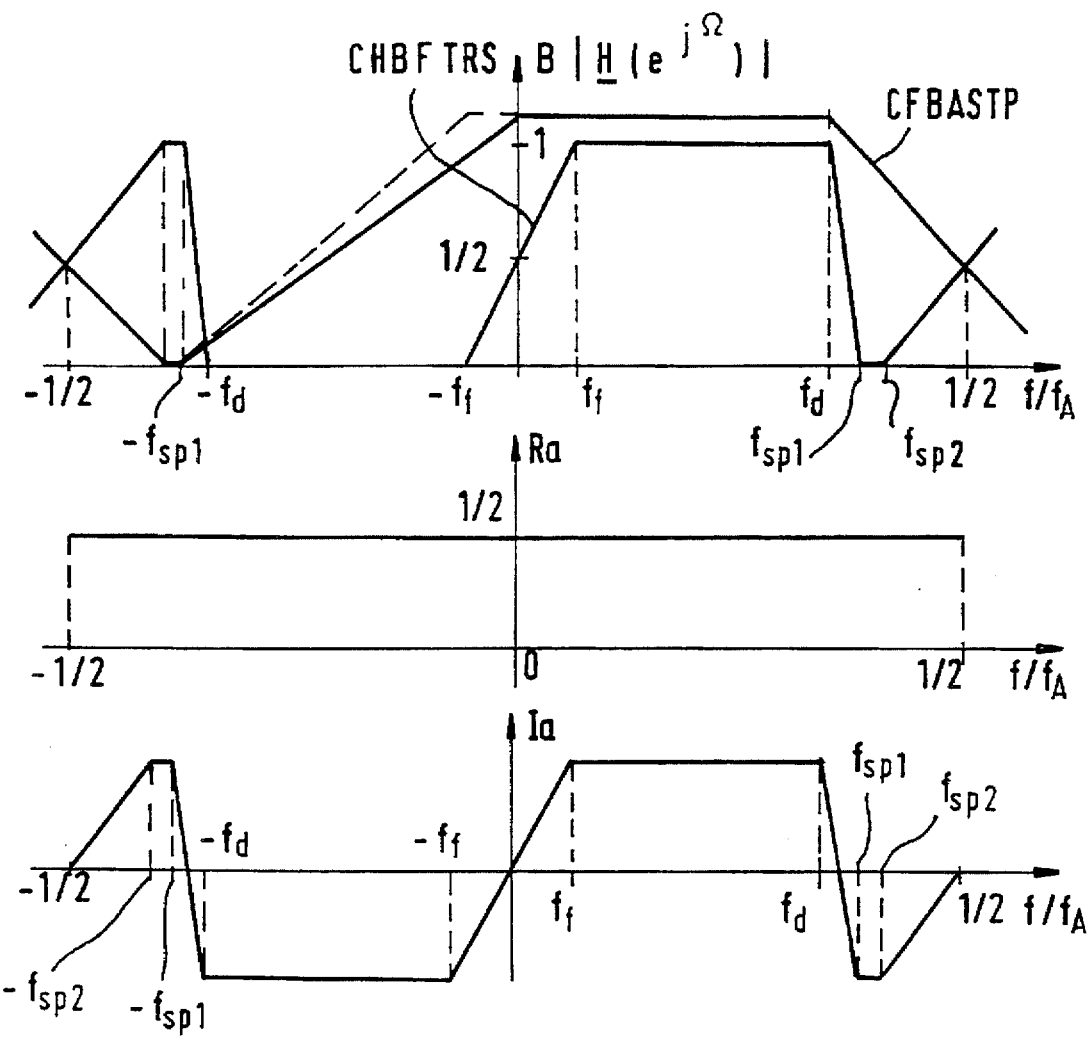
Figure 20:
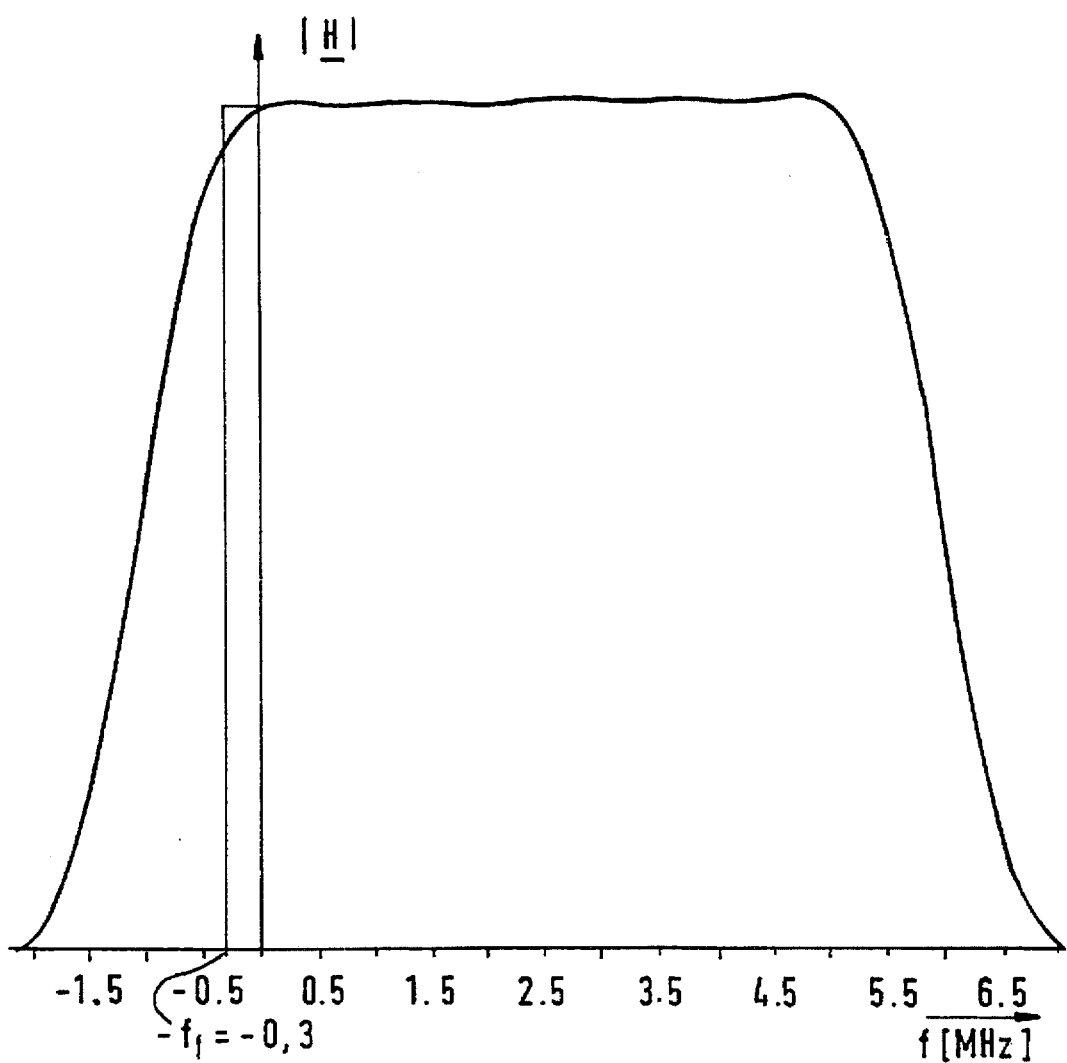
Figure 21:
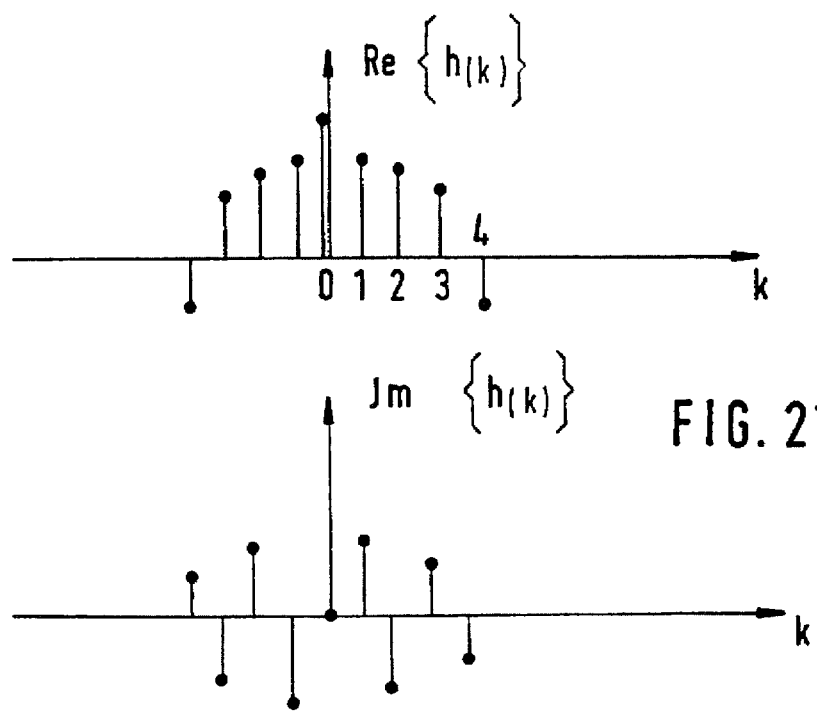
Figure 22:
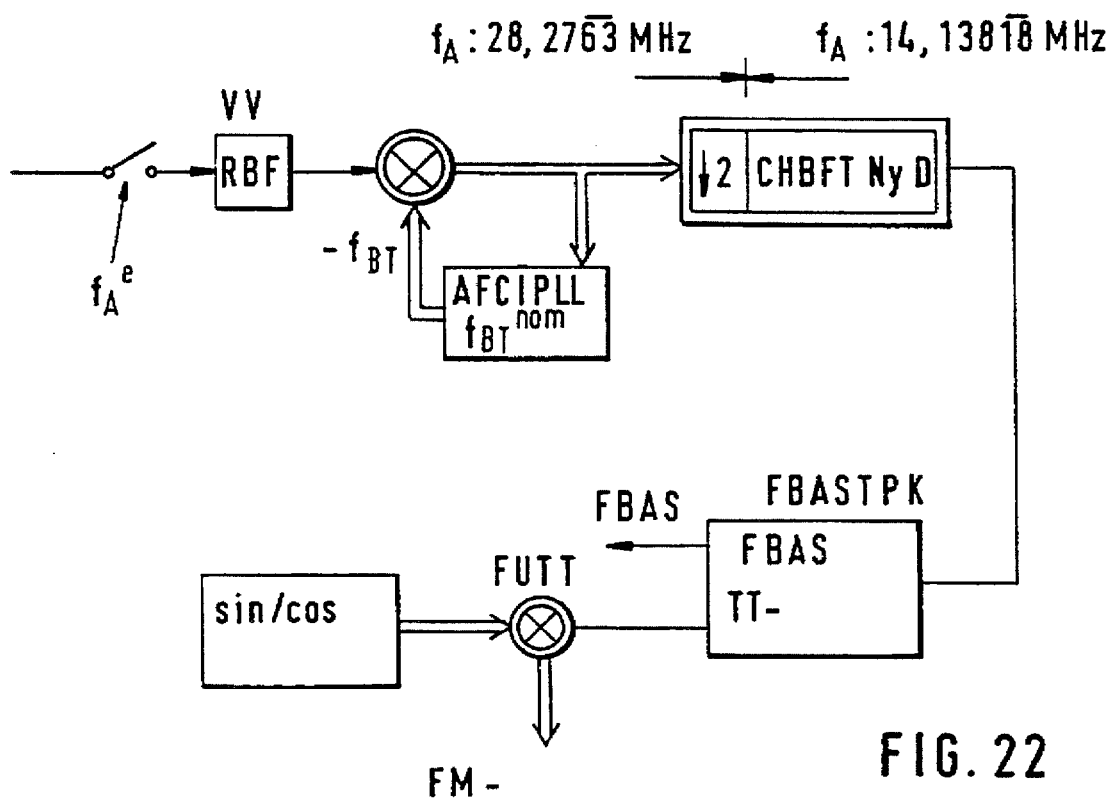
Figure 23:
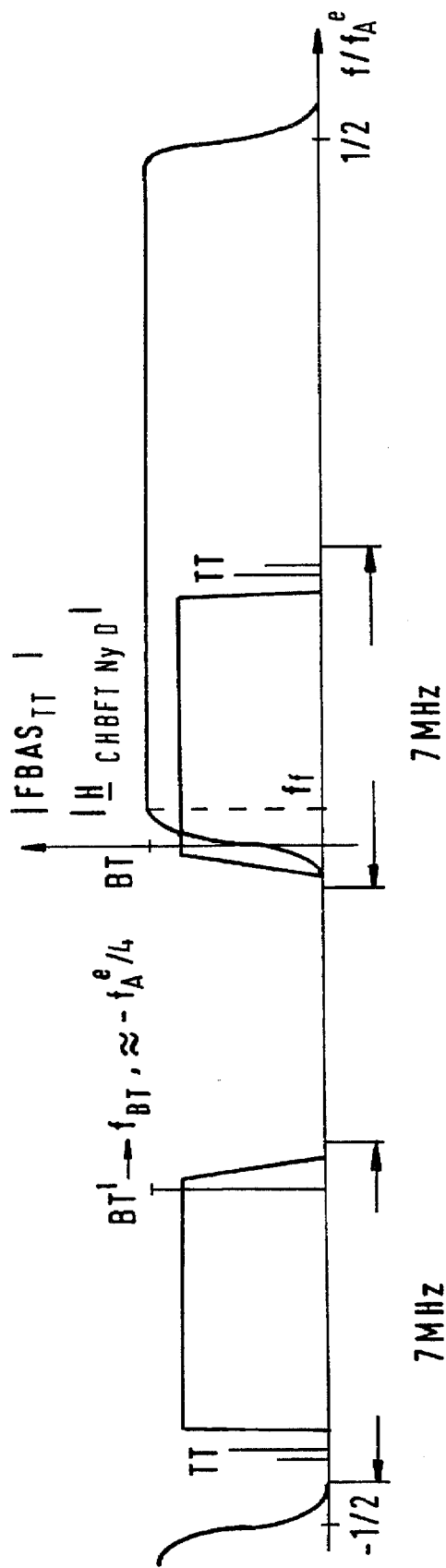
Figure 24A:
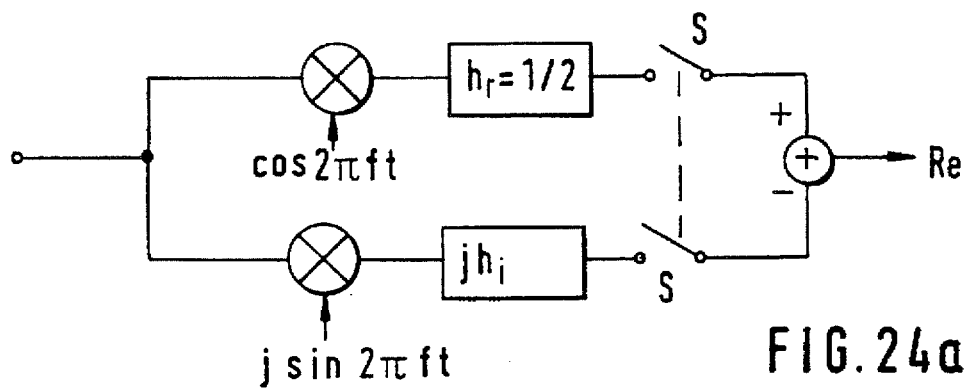
Figure 24B:
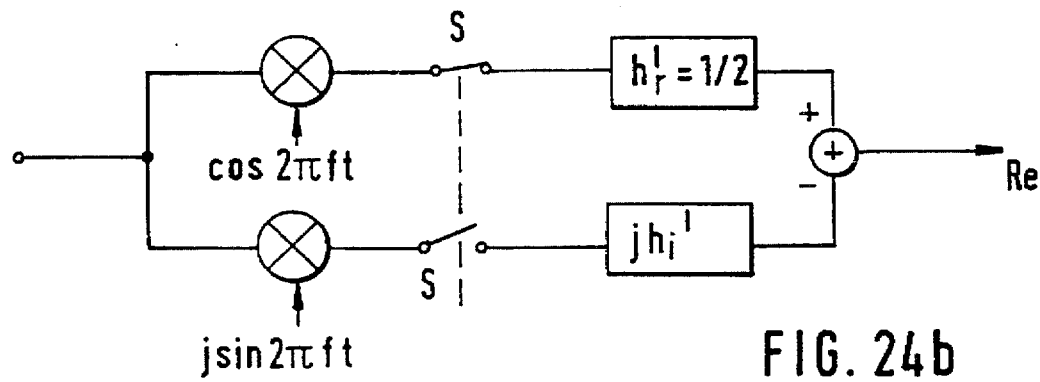
Figure 24C:
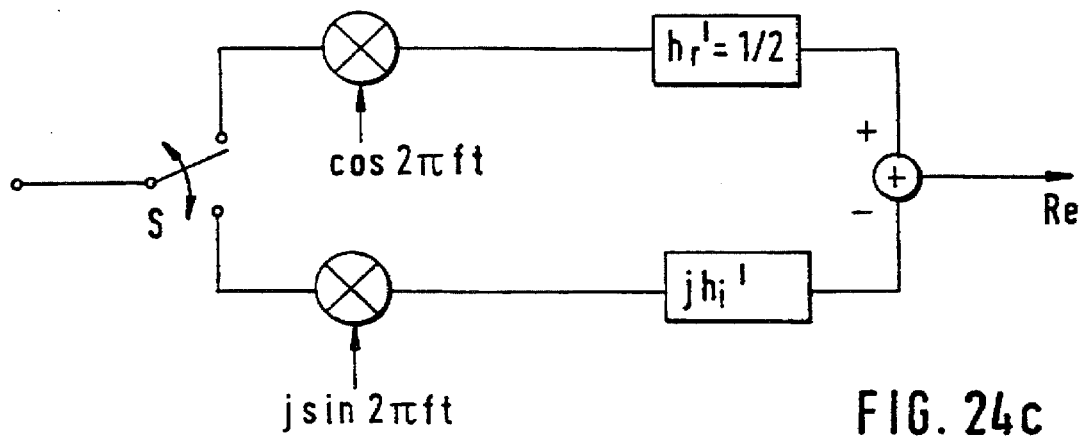
Figure 25:
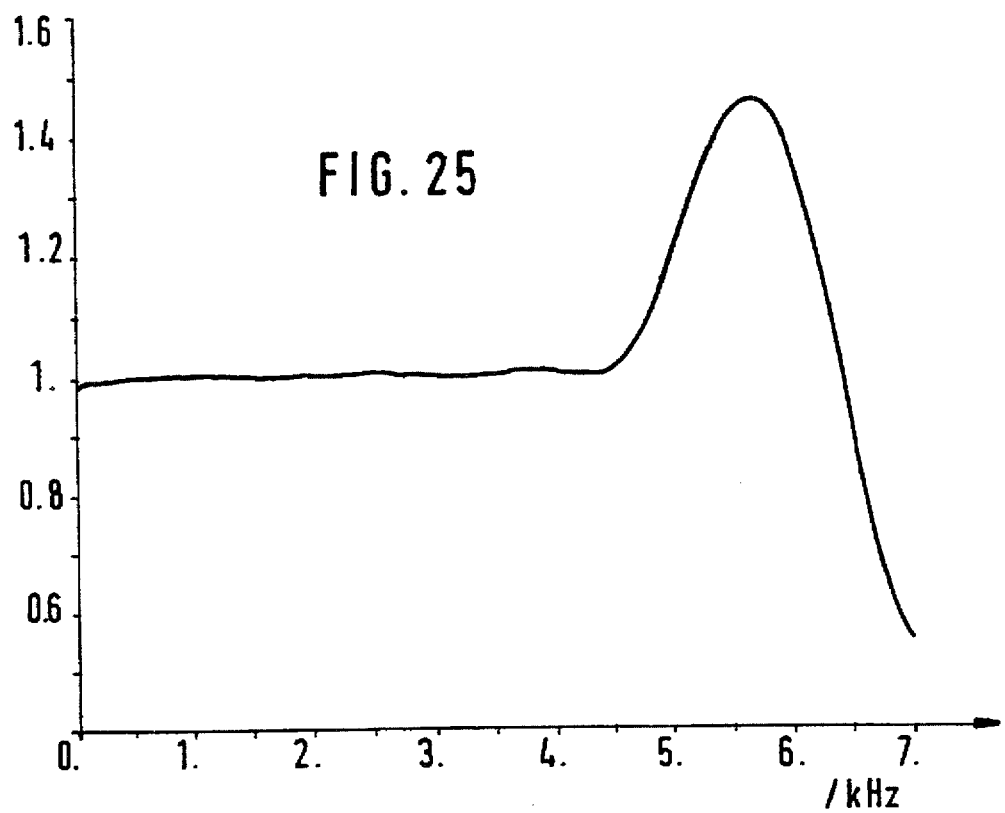
Figure 26:
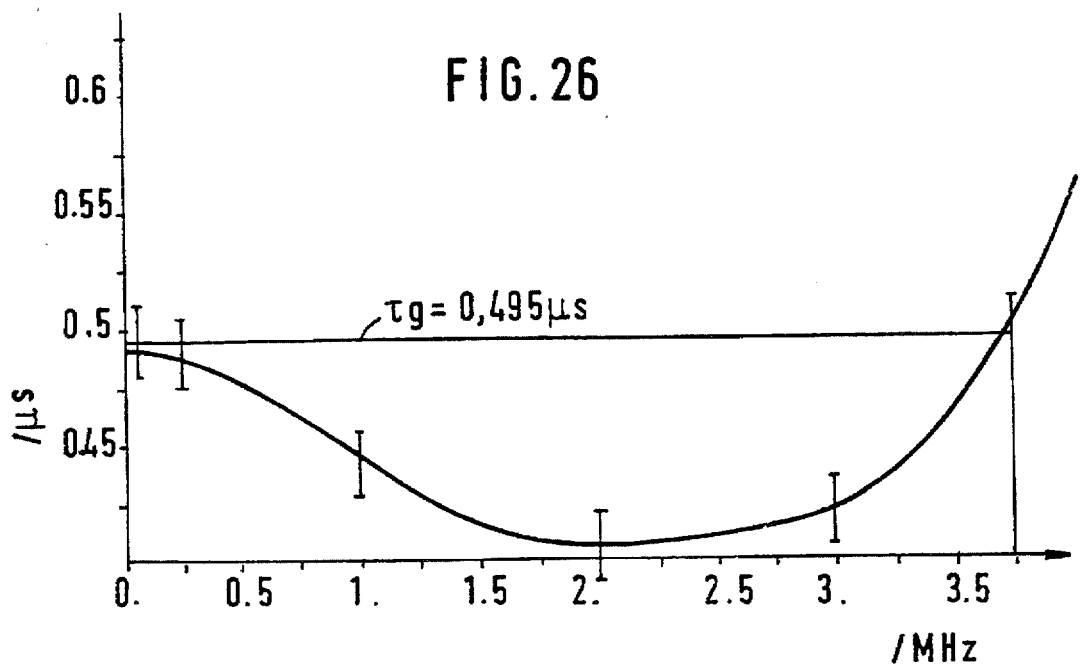

Exemplary embodiments of the invention are explained in greater detail with reference to the drawings, in which:

FIG. 1 shows the frequency position of a mixed-down IF composite color picture signal, FIG. 2 shows a block circuit diagram of a demodulator according to the invention, FIG. 3 shows a block structure for converting a complex-value signal into a real-value signal, FIG. 4 shows the transmission functions of a Nyquist slope filter which is composed of two subfilters and has selection properties, FIG. 5 shows the transmission function of a demodulator filter according to the invention, FIG. 6 shows a block structure for a Nyquist filter according to the invention, FIG. 7 shows transmission functions of a realized Nyquist slope filter without a TT trap, FIG. 8 shows a realized filter structure, FIG. 9 shows the frequency response curve corresponding to FIG. 8, FIG. 10 shows a lowpass structure for sound suppression, FIG. 11 shows a TV demodulator with sound carrier extraction, FIG. 12 shows filter structures of a composite color picture signal/TT filter, FIG. 13 shows a block structure of a Nyquist slope filter with sound carrier trap, FIG. 14 shows transmission functions of the filter according to FIG. 13, FIG. 15 shows a block structure which is derived from FIG. 13, FIG. 16 shows a block circuit diagram for extracting the sound signals in the complex-value range, FIG. 17 shows the subtransmission functions corresponding to the scheme according to FIG. 16, FIG. 18 shows the passband of a filter for sound suppression, FIG. 19 shows the coefficients of the filter according to FIG. 18, FIG. 20 shows the frequency response of a filter constructed according to FIG. 19, FIG. 21 shows the coefficients of a modified filter, FIG. 22 shows a TV demodulator scheme with decimating, complex Nyquist slope filter, FIG. 23 shows the IF spectrum shifted to $f_{BT}=0$, FIG. 24 shows structure blocks for clarifying how mixing and filtering are transposed, FIG. 25 shows the absolute-value profile of a group delay equalizer and FIG. 26 shows the corresponding propagation time plotted against frequency.

A Nyquist slope filter can be used to demodulate vestigial sideband signals, such as for example television signals in an intermediate frequency position (IF composite color picture signal), if the Nyquist frequency (6 dB point of the symmetry) lies exactly at the carrier frequency. An IF composite color picture signal constitutes in principle an AM signal in which a sideband has been suppressed as far as 759 kHz at the video carrier BT. FIG. 1 shows the position of such a signal in the frequency pattern, a repeating spectrum being produced by digitizing (sampling) this signal (1st repetition at the sampling frequency $f_{AV}$). The sound carriers which are contained in the composite color picture signal are designated by TT1 and TT2 so that the signal to be processed is designated in simplified form as the FBAS$_{TT}$ signal. At the input of the demodulator (illustrated in FIG. 2) there is a mixing stage MS which mixes a complex-value digital signal with the present value of the video carrier frequency $f_{BT}$ to f=0. The Nyquist frequency of the complex Nyquist slope filter is thus $f_{NY}=0$, with a width of the slope area of BF=2×750 kHz=1.5 MHz. Since the Nyquist slope filter can be realized as a complex halfband filter it is designated below as CHBF Ny (DE 37 05 206 C2).

In order to acquire a complex-value digital signal (complex-value digital signals are symbolized in the drawings by double bars) from the sampled real IF composite color picture signal, a preprocessing stage W (complex filter stage) is provided which is described in detail in the German Patent Application P 44 17 723.2.

The vestigial sideband demodulator CHBFTRSB can be realized by means of the Nyquist slope filter CHBF Ny, downstream of which a lowpass filter FBASTP for suppressing or separating off the sound signals TT is connected according to the refinement in accordance with FIG. 2. Only the real part or the imaginary part of the output signal of the Nyquist slope filter CHBF Ny is passed on to the lowpass filter FBASTP, since the range [$f_{AV}/2$, $f_{AV}$] does not contain any disruptive spectral components (FIG. 1).

To aid further comprehension of the invention, several principles for filters with complex-value coefficients are now given. h(z) represents the transmission function of a filter with complex coefficients in accordance with the complex pulse response h(k).

$$H(z) \bullet \!\!-\!\!\!\circ \underline{h}(k) = \underline{h}(kT)$$

where $z = e^{j\Omega} = e^{j2\pi f/f_A}$ where $f_A = 1/T$ constitutes the sampling frequency.

h(k) can be resolved into a real part $h_R(k)$ and an imaginary part $h_I(k)$ in accordance with:

$$\underline{h}(k)=h_R(k)+jh_I(k)$$

and according to |1|:

$$Ra[\underline{H}(e^{j\Omega})] = \frac{1}{2} [\underline{H}(e^{j\Omega}) + \underline{H}^*(e^{-j\Omega})] \bullet\!\!-\!\!-\!\!-\!\!\circ\; h_R(k)$$

$$Ia[\underline{H}(e^{j\Omega})] = \frac{1}{2j} [\underline{H}(e^{j\Omega}) - \underline{H}^*(e-j\Omega)] \bullet\!\!-\!\!-\!\!-\!\!\circ\; j_I(k)$$

The result of these two relations is that
a) an exact Nyquist slope can be realized and
b) the real part Ra must be a general selection filter (lowpass/bandpass) and
c) the imaginary part Ia must be a Hilbert transformation function HT, also with selection properties.

When nonrecursive (FIR) filters are used, Ra generally has positive symmetrical coefficients and Ia have negative symmetrical coefficients. FIG. 3 shows as an example a filter for converting a complex-value signal $(X_R(k), X_I(k))$ into a real-value signal $(y_R(k))$. Both subfilters Ra and Ia are equally complex.

FIG. 4 shows the transmission function of these two subfilters and of the entire filter $\underline{H}(e^{j\Omega})$. According to |2|, $f_g=f_A/2$ is permanently prescribed, for which reason the selection properties of $\underline{H}(e^{j\Omega})$ cannot be changed. The consequence of this is that:

Ra is a constant $h_o$, that is to say a filter with only one coefficient. In the case which can be realized in a causal fashion, this constant is combined with a delay $\{(N-1)/2\}T$ if N is the filter length (FIR realization).

Ia is a conventional Hilbert transformation function without selection properties.

In comparison with the realization method according to |1|, the number of multiplications is approximately halved; the disadvantage is that the selection properties are fixed and cannot be freely selected.

Below, a filter is presented which, according to the invention, has the desired Nyquist slope, has freely selectable selection properties with certain restrictions and whose complexity, in particular with regard to the number of multiplications in the filter chain, is intended to be similar to that in |2| (Ra has only one filter coefficient). The transmission function for the demodulator filter according to the invention is obtained from FIG. 5. It is made up of the two subtransmission functions Ra and Ia. In the range $[-f_A/2, +f_A/2]$, Ia has the constant absolute value $h_o=\frac{1}{2}$. Ia is point-symmetrical with respect to f=0. Its transmission function alternates between j/2 and -j/2. It is a generalized Hilbert transformation function which has a simple number (generally an odd number) of zero positions between in each case two different ranges (passbands or stopbands).

While it is always possible with the realization methods according to |1| and |2| to derive the complex Nyquist slope filter from a prototype with real coefficients, this is ruled out with the solution according to the invention. The frequency response which is characterized by FIG. 5 is sufficient for a TV vestigial sideband demodulator, in particular with regard to the required selection properties. The main properties of the demodulator filter according to the invention will be briefly summarized once more:

Ra has an odd number of coefficients $h_{(k)}$ which satisfy the condition $$h_{(k)}=h(-k)$$

according to the method according to FIG. 5 it is particularly advantageous that:
there is only one coefficient,
for a specific parameter k a coefficient is either purely real or purely imaginary,
Ia is a Hilbert transformation function with an odd number of coefficients to which the following applies:

$$h(-k)=-h(k),$$

Ra and Ia are logically linked in such a way that at least one passband and one stopband are produced. For Nyquist slopes which do not lie at f=0, the following relations are obtained
a) Nyquist slope at $f_A/2$:

$$\underline{h}'(k)=(-1)^k\underline{h}(k)$$

b) Nyquist slope at $f_A/4$ or $3f_A/4$:

$$\underline{h}''(k)=(\pm j)^k\underline{h}(k).$$

For b), the coefficients are alternately real or imaginary; the work of multiplication is, as with the structure according to FIG. 3, now distributed evenly to both subfilters.

The Nyquist slope filter CHBF Ny according to the invention advantageously has the structure according to FIG. 6:

$$Ra\{H\}\rightarrow hr=\frac{1}{2}$$

$$jIa\{H\}\rightarrow jhi.$$

In order to specify such a filter the following values apply:
$f_A=14.13818$ MHz
$f_f=750$ kHz (slope area)
$f_d=f_A/2-f_f=6.31$ MHz
Passband:
$f_f \ldots f_d$ with passband ripple of $\Delta a_{pp} \leq 0.1$ dB.

As is clear from FIG. 7, the passband is prescribed at the upper (undefined) end in such a way that the Nyquist slope filter becomes a complex halfband filter CHBF:
$F_D$ CHBF$=f_d-f_A/4=2.7845$ MHz.

With a filter length of N=19, $\Delta a_{pp}=0.16$ dB is obtained, which is sufficient for application as a TV demodulator.

The multiplication rate (center coefficient $h_r=\frac{1}{2}$ is included in the calculation but without using the symmetry) is obtained as follows:

$$M_A^{Ny} = \left(1+\frac{N+1}{2}\right)f_A = 11 f_A.$$

The filter structure which is realized—non-recursive transversal filter—is illustrated in FIG. 8 with associated frequency response curve (absolute value) in FIG. 9. The $h_i$ coefficients can be found in Table 1.

For the downstream lowpass filter FBASTP for suppressing the sound carriers TT—sound trap—the following specification applies:
$f_A=14.13818$ MHz,
passband: 0 ... 4.9 MHz,
fd=4.9 MHz,
$\Delta a_{pp} \leq 0.1$ dB,
stopband 1: $f_{sp1} \ldots f_{sp2}$: 5.42 ... 5.83 MHz $a_s \geq 50$ dB stopband 2 (in order to avoid undesired amplifications): $f_{sp2}$ ... $f_A/2$, $a_s \geq 6$ dB.

With a filter length N=63, the result is $\Delta a_{pp} \approx 0.0$ dB $a_s=51$ dB.

Multiplication rate:

$$M_A^{TF} = N \cdot f_A = 63 f_A$$

The lowpass filter FBASTP can consist, for example, of a simple transversal filter structure according to FIG. 10 with an input for the real parts of the Nyquist slope filter CHBF Ny. Its coefficients are shown in Table 2. Accordingly, for the entire filter CHBFTRSB the following is obtained:

$$M_A = M_A^{Ny} + M_A^P = 74 f_A.$$

In an extension, the lowpass filter FBASTP can not only be constructed as a sound carrier trap but also have a further output (sound filter) for extracting the sound carrier(s) from the TV demodulator (FIG. 11). The two sound carriers TT are located as a real signal approximately at 5.625 MHz, that is to say an extremely long way from $f_A/4$. If the FM sound demodulation is to be carried out with a complex carrier oscillation which is derived from the video demodulator (for example in P 44 17 723.2 or P 44 17 724.0), the conversion of the real sound carriers into complex ones is carried out advantageously with the Weaver method.

For the extension of the lowpass filter according to FIG. 11, a complementary filter structure FBASTPK is used whose filter length N is not to be increased in comparison with the previous solution.

If $H_{(z)} = \sum_{n=1}^{N} h_{(k)} z^{-n}$ represents the transmission function of the sound trap FBASTP according to FIG. 10, the following transmission function which is complementary thereto is obtained $$Hc(z) = \pm \left( z^{-\frac{N+1}{2}} - H(z) \right)$$
$$= \pm \sum_{n=1}^{N} h'_n z^{-n}$$

where $h'_n = h_n \forall n \neq \frac{N+1}{2}$ $h'_{\frac{N+1}{2}} = 1 - h_{\frac{N+1}{2}}$ Various possible realization methods for this are illustrated in FIGS. 12a to c. The universal filter component UFB which is shown in DE 43 05 075 C1 can advantageously be used for this.

A further refinement of the vestigial sideband demodulator according to the invention is obtained by combining Nyquist slope filtering and the sound carrier trap in one filter. The structure of this filter is shown in FIG. 13. The entire filter is designated by CBFT Ny TT. The associated transmission functions of the sub-filters Ra and jIa are illustrated in FIG. 14. As before, the filter slopes, stopbands and passbands are designated by $f_f$, $f_d$ and $f_{sp}$. As is clear from FIG. 4 and FIG. 14, the Ra branch constitutes the variant of the filter FBASTP in FIG. 2 scaled by the factor ½. The structure in FIG. 15 shows this more clearly. In the Ia branch, jh$_i'$ realizes the frequency response—Hilbert transformation function HT in FIG. 7—and the filter FBASTP brings about the band limiting at the upper band end. Both cascaded transmission functions can be combined to form a single Hilbert transformation function HT whose upper band limitation is specified in accordance with Ra and whose Nyquist slope is specified in accordance with Ia. Since the frequency response which is required in this way is, in contrast with FIG. 7, not symmetrical with respect to $f_A/4$, all the coefficients of the Hilbert transformation function HT, with the exception of the central one, are not equal to zero. The filter length N is determined by the steeper transition region for the sound trap at the upper band edge. Thus, it follows directly that Ra and Ia(HT) require the same filter length N=63 (FBASTP). This results in the following for the multiplication rate:

$$M_C = \underbrace{N' \cdot f_A}_{Ra} + \underbrace{(N-1) f_A}_{Ia} =$$
$$= (2N-1) f_A = 125 f_A.$$

In order to reduce excessive values in the Nyquist slope region, the slope region $f_f$ is selected to be $\leq 750$ kHz. The solution, presented latterly, with the entire filter CBFT Ny TT is more complex than the previously described schemes. Furthermore, no additional advantages result for the FM sound processing.

A further refinement of the invention according to FIG. 16 takes up the realization method according to FIG. 6 once more. The filter module CHBFTRSB supplies a complex-value output signal which is fed to a sound trap CFBASTP for complex-value input signals. The complex-value output signal of the filter module CHBFTRSB is fed directly to a mixing stage FUTT which converts the complex-value signal with a frequency $-½ (f_{T1}+f_{T2})$. After a decimation (sampling rate conversion) in a video trap VF, for example by the factor 15, this signal can be used as a mixing signal in the FM sound demodulator, for example in accordance with P 44 17 724.0. The subtransmission functions of the CHBFTRSB and CFBASTP are shown by FIG. 17. Of all the previously presented schemes, the complexity with FM demodulation is reduced to the greatest degree. The multiplication rate for this scheme is:

$$M^{RSB} = 2N \cdot f_A = 126 f_a.$$

For a way of realizing the filter CFBASTP which is favorable in terms of complexity, use can be made of the fact that only one real signal (Re) has to be output. For the passband, an expansion up to −750 kHz, corresponding to $f_f$, is not necessary (broken line in FIG. 17), so that the passband edge can be at the videocarrier frequency f=0.

Two different possible ways of deriving the filter CFBASTP from a real prototype filter are now presented. In the first case I, the prototype is a real halfband filter HBF. In the second case II, the prototype is a real lowpass which leaves the transition region with an optimum width.

The center frequency of the passband range of CFBASTP is at $$f_m = ½ \cdot 4.9 \text{ MHz} = 2.45 \text{ MHz}.$$

If the frequency response is shifted by $-f_m$, the passband range which is originally centered at $f_m$ lies at f=0 (FIG. 18). By correspondingly shifting the stopband edges $f_{sp}$, a desired stopband of 5.8581 ... 6.2681 MHz is achieved.

When $f_A = 14.13818$ MHz $f_d = fm = 2.45$ MHz and $a_s = 50$ dB, the following is obtained:

N=19 (filter length)

$\Delta a_{pp} = 0.03$ dB

FIG. 19 shows the coefficients of the filter CFBASTP or Re {h(k)} and Im {h(k)}, and FIG. 20 shows the frequency response of this filter. With somewhat reduced requirements with respect to ripple and stopband attenuation, the filter complexity can be reduced to N=11.

For the derivation of the filter CFBASTP according to Case II, the filter coefficients according to FIG. 21 are obtained with similar preconditions.

A further scheme of a TV demodulator according to the invention is shown in FIG. 22. Here, the sequence of filtering and frequency regulation (or mixing) AFC/PLL is transposed to the video carrier $f_{BT}^{nom} = 17.6527$ MHz. The complex Nyquist slope filter is of decimating design—CHBFT Ny D—in this case, i.e. the system operates with an internally reduced sampling frequency: 14.13818 MHz instead of $f_A = 28.2763$ MHz during the sampling of the IF signal. The decimation factor—2 here—corresponds to that factor by which the complex-value television signal was previously oversampled. It is a precondition for the decimating, complex Nyquist slope filter CHBFT Ny D that the AFC-PLL loop is correctly locked, corresponding to a video carrier frequency $f_{BT} = 0$ Hz.

The IF spectrum which is shifted to $f_{BT} = 0$ is illustrated in FIG. 23. As a result of the wide gaps between the useful spectrum and mirror spectrum, the mirror spectrum lies completely in the stopband. With an HBF prototype realization method, the filter length can be set at N=75, it being a precondition that all the multiplications were carried out with half the initial sampling frequency. The structure blocks according to FIGS. 24a to c serve to clarify the principle of transposing mixing and filtering. Complex mixing is indicated by the two carrier oscillations cos 2π ft and j sin 2π ft. In the Ra branch, as before only the coefficient $h_r = \frac{1}{2}$ is present and in the Ia branch there is jhi', to be more precise every second coefficient being identically zero. The decimation is illustrated diagrammatically in FIG. 24a by the two samplers S downstream of the filter branches.

In Case 24b, the samplers S are drawn upstream of the filter branches which are controlled in push-pull mode. The chains of delay elements of the filter branches with the coefficients $h_r = \frac{1}{2}$ and jhi' now each have half the length with the elimination of the zero coefficients.

Finally, in FIG. 24c the Switches S are adjoined to form a center point switch upstream of the mixing devices; i.e. in FIG. 24c the decimation is drawn in front of the mixing, which reduces the multiplication rate by 2. The latter solution also has the advantage of a simpler design of the AFC/PLL loop (sin/cos table). The previously mentioned UFB module can also be used for the scheme according to FIG. 22.

A group delay equalizer FBASEBT may be necessary for the upstream TV demodulator, which group delay equalizer FBASEBT is connected downstream of the sound trap FBAST, the sound filter FBASTPK or the combination filter CHBFT Ny TT. This group delay equalizer is intended to have an absolute value profile which is as constant as possible, but a non-linear phase profile. Preferably, the group delay equalizer FBASENT consists of two FIR filter blocks F1 and F2, hg having an even pulse response and hu having an odd pulse response. The sub-filter F1 has two positively symmetrical coefficients $h_o g_{(k)}$ and the subfilter F2 has negatively symmetrical coefficients $h_o u_{(k)}$.

The filter length is N=14 for the even component and N=15 for the odd component. FIG. 25 shows the absolute value for a realized group delay equalizer, and FIG. 26 shows the propagation time τg plotted against the frequency.

I claim:

1. A demodulator for a complex-value vestigial sideband signal consisting of a digital Nyquist slope filter (CHBFN$_y$) having a transmission function with complex coefficients h(k), k being an integer, said digital Nyquist slope filter including a first subfilter (Ra) and a second subfilter (Ia), said first subfilter (Ra) having a transmission function with an odd number of coefficients h(k) for which h(k)=h(-k) and said second subfilter (Ia) having a Hilbert transformation function with an odd number of coefficients h(k) for which h(-k)=-h(k), so that each of said coefficients h(k) of the Nyquist slope filter are either purely real or purely imaginary for each value of said k and said subfilters (Ra, Ia) having outputs connected to each other an adder stage in an additive or subtractive manner so as to produce at least one passband and one stopband, and a digital filter device (FBASTP) having a transmission function with real coefficients for suppressing at least one subcarrier in the vestigial sideband signal, wherein the transmission functions of the subfilters (Ra, Ia) for a real part and an imaginary part are combined with respect to the digital filter device (FBASTP) and Nyquist slope filter (CHBFNy), and said digital filter device (FBASTP) is integrated with said Nyquist slope filter (CHBFNy) or connected downstream of said Nyquist slope filter (CHBFNy).

2. The demodulator as claimed in claim 1, wherein said coefficients of the transmission function of the first subfilter (Ra) are purely real coefficients $h_R(k)$, said coefficients of the Hilbert transformation function of the second subfilter (Ia) are purely imaginary filter coefficients $h_I(k)$, said purely imaginary filter coefficients are symmetrical relative to a center coefficient so that individual coefficients of pairs of said purely imaginary filter coefficients symmetrically displaced relative to the Center coefficient have the same absolute values and only differ by sign and the center coefficient is equal to 0.

3. The demodulator as claimed in claim 2, wherein the transmission function of the first subfilter (Ra) has only one of said coefficients so that:

$$h_R(k) = \frac{1}{2}$$

wherein $h_R(k)$ is the real part of h(k), and the Hilbert transformation function of the second subfilter (Ia) has a center coefficient equal to 0.

4. The demodulator as claimed in claim 1, wherein the Nyquist slope filter is a decimating filter (CHBFTNyD).

5. The demodulator as claimed in claim 4, wherein the decimating filter (CHBFTNyD) has a filter branch (Ra) having a transmission function with only one coefficient $h_R = \frac{1}{2}$ and another filter branch (Ia) having a Hilbert transformation function with only one Hilbert operator (jhi').

6. The demodulator as claimed in claim 1, wherein the complex-value vestigal sideband signal is a television signal comprising a video carrier and at least one sound carrier, and further comprising a complex mixing stage (MS) upstream of the Nyquist slope filter (CHBFNY), connected to the Nyquist slope filter (CHBFNY) and having a mixing frequency (−fBT) selected so that the video carrier of the television signal appears at a frequency equal to 0.

7. The demodulator as claimed in claim 6, wherein the Nyquist slope filter is a decimating filter (CHBFTNyD) and the decimating filter (CHBFTNyD) has a decimation factor corresponding to a factor by which the television signal was previously oversampled with respect to a useful bandwidth of said television signal.

8. The demodulator as claimed in claim 6, wherein the Nyquist slope filter (CHBFNY) has only one output for a real-value digital signal.

9. The demodulator as claimed in claim 1, further comprising a mixing device (FUTT) connected to the Nyquist slope filter (CHBFNy) and downstream of the Nyquist slope filter (CHBFNy), and wherein the Nyquist slope filter (CHBFNY) includes means for generating a complex-value digital signal and for feeding said complex-value digital signal to said mixing device (FUTT).

10. The demodulator as claimed in claim 9, further comprising a sound trap (CFBASTP) for a complex-value input signal and wherein a complex-value output signal of the Nyquist slope filter (CHBFNy) is fed both to said mixing device (FUTT) to produce a mixing signal for an FM sound demodulator and to said sound trap (CFBASTP) as said complex-value input signal.

11. The demodulator as claimed in claim 10, wherein said sound trap (CFBASTP) includes means for producing only real output signals.

12. The demodulator as claimed in claim 11, wherein the sound trap has a lower passband with a passband edge and the passband edge in the lower passband of the sound trap is located at a video carrier frequency equal to 0.

13. The demodulator as claimed in claim 11, wherein the sound trap (CFBASTP) is derived from a real halfband filter as prototype.

14. The demodulator as claimed in claim 11, wherein the sound trap (CFBASTP) is derived from a real lowpass filter as prototype.

15. The demodulator as claimed in claim 1, wherein said digital Nyquist slope filter (CHBFNY) and said digital filter device (FBASTP) are combined to form a combination filter (CBFTNyTT) including means for suppressing at least one sound carrier of said vestigal sideband signal and said combination filter (CBFTNyTT) includes means for scaling an output of a lowpass filter portion of said subfilter (Ra) for suppression of sound, and wherein said coefficients of said Hilbert transformation function (HT) of the subfilter (Ia) of said combination filter (CBFTNyTT) are not equal to zero, except for a central coefficient of said Hilbert transformation.

16. The demodulator as claimed in claim 1, wherein the filter device (FBASTP) comprises a sound filter (FBASTPK) having means for suppressing at least one sound carrier of said vestigal sideband signal.

17. The demodulator as claimed in claim 16, wherein the means for suppressing at least one subcarrier is a means for suppressing a sound carrier.

18. The demodulator as claimed in claim 1, further comprising a group delay equalizer (FBASENT) connected to an output side of said Nyquist slope filter, and wherein said group delay equalizer (FBASENT) includes two FIR filter blocks, one of said FIR filter blocks having a transmission function with positively symmetrical coefficients and the other of said FIR filter blocks having a transmission function with negatively symmetrical coefficients.

19. The demodulator as claimed in claim 1, wherein said complex-value vestigial sideband signal is a television signal including a video carrier and at least one sound carrier.

20. A demodulator as defined in claim 1, wherein the outputs are connected to each other by the adder stage which is fed by two output signals of positive sign.

21. A demodulator as defined in claim 1, wherein the outputs are connected to each other by an adder stage which is fed by two output signals, one of which being with positive sign and the other with negative sign.

* * * * *